United States Patent
Kitamura et al.

(10) Patent No.: US 7,279,902 B2
(45) Date of Patent: Oct. 9, 2007

(54) BATTERY CHARACTERISTIC EVALUATION DEVICE AND BATTERY CHARACTERISTIC EVALUATING METHOD

(75) Inventors: Toshiya Kitamura, Tokyo (JP); Kenichi Harigae, Tokyo (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 290 days.

(21) Appl. No.: 10/834,973

(22) Filed: Apr. 30, 2004

(65) Prior Publication Data

US 2005/0001588 A1    Jan. 6, 2005

(30) Foreign Application Priority Data

May 9, 2003    (JP) .............................. 2003-131235

(51) Int. Cl.
*G01N 27/416*    (2006.01)
(52) U.S. Cl. ..................................... 324/432
(58) Field of Classification Search ................ 320/127, 320/132, 147; 324/425, 426, 432, 427
See application file for complete search history.

(56) References Cited

U.S. PATENT DOCUMENTS 5,304,433 A  *  4/1994  Cherng ....................... 429/91

FOREIGN PATENT DOCUMENTS

JP              1021954      *  7/1996
RU              2046461      *  10/1995

OTHER PUBLICATIONS

Fujishima et al., "Methods of Electrochemical Measurement," Gihodo Publisher, Chapters 3 and 4, Experimental Chart 3.1, Fig. 3-2, no date.

* cited by examiner

Primary Examiner—Edward H Tso
(74) Attorney, Agent, or Firm—Oliff & Berridge, PLC

(57) ABSTRACT

To provide a battery characteristic evaluation device and a battery characteristic evaluation method capable of precisely measuring a potential difference between a positive and negative electrode materials, without largely breaking the original battery shape of a sealed battery such as a sealed alkaline-manganese battery. A cylindrical alkaline-manganese battery sample 30 is prepared, wherein a bore hole of 1 mm diameter and 0.5 mm depth is provided in approximately the center of the side face of a can body, lead wires are provided in the positive and negative electrodes, a sealing material made of a resin is applied on the negative electrode so as not to come into contact with an electrolytic solution. The battery sample is dipped into a measuring cell 10 in which an electrolytic solution 11 is filled. A tip 23 of a Luggin tube 21 constructing a reference electrode 20 is placed near the bore hole 40, a prescribed load is applied on the battery sample 30, and a voltage between positive and negative electrodes per discharging time, and a voltage between a positive electrode and a reference electrode is measured, and from the values obtained, the voltage between the negative electrode and the reference electrode is calculated, thereby precisely measuring the potential difference between the positive and negative electrode materials.

1 Claim, 10 Drawing Sheets

BATTERY CHARACTERISTIC EVALUATION DEVICE AND BATTERY CHARACTERISTIC EVALUATING METHOD

BACKGROUND OF THE INVENTION

1. Field of the Invention

The present invention relates to a device for measuring a battery characteristic of a sealed battery and a measuring method for the same.

2. Description of the Related Art

Conventionally, in order to evaluate a battery characteristic such as an electromotive force of a battery or a discharging characteristic of the battery, the battery is discharged under a prescribed condition, and change in voltage between positive and negative electrodes per fixed time and the voltage between positive and negative electrodes per battery discharging capacity are measured and evaluated.

Moreover, when evaluating each single pole of positive and negative electrodes, the single polar condition is reproduced by using a simple cell and a reference electrode, etc., and by measuring the voltage of the cell, etc., the evaluation is conducted. (See, Akira Fujishima, Masuo Aizawa, and Toru Inoue, "Methods of Electrochemical Measurement", Gihodo Publisher, Chapters 3 and 4, Experimental Chart 3.1, FIG. 3-2, and the like).

According to a method for measuring the voltage between positive and negative electrodes per fixed time, and the change in the voltage between positive and negative electrodes per battery discharging capacity for determining the battery characteristic, the battery voltage that appears as a phase difference between positive electrode potential and negative electrode potential is evaluated. Therefore, the problem is that it is difficult to determine whether the voltage thus obtained and the battery characteristic are caused by a positive electrode material or a negative electrode material, and it is difficult to obtain a useful information for a material development of the positive/negative electrode materials. For example, in the battery voltage of 1.5 V, there is a case that the positive electrode potential is 1.2 V and the negative electrode potential is −0.3 V, or there is also the case that the positive electrode potential is 0.3 V, and the negative electrode potential is −1.2 V.

Meanwhile, when evaluating the positive electrode material and the negative electrode material per every single pole using a simple cell and a reference electrode, etc., for example, the potential per every positive electrode and negative electrode and the battery characteristic can be measured by placing the reference electrode near the electrode intended to be measured. However, the evaluation results obtained by such a measuring method have various problems when the above evaluation results are applied to an actual battery such as a sealed alkaline-manganese battery, because the evaluation results are obtained from the measurement using a simple cell which is largely different from the actual battery in an electrode structure, a battery structure, and the like.

Therefore, the present invention provides the battery characteristic evaluation device and the battery characteristic evaluation method capable of separately and precisely measuring the potentials of the positive electrode material and the negative electrode material, without largely breaking the shape of the original battery shape of the sealed battery such as a sealed alkaline-manganese battery.

SUMMARY OF THE INVENTION

That is, in order to solve the above-described problems, a first aspect of the present invention provides a battery characteristic evaluation device of a sealed battery, comprising:

an electrolytic solution outside the sealed battery and contacting the electrolytic solution contained in the sealed battery;

an electrode dipped into the electrolytic solution outside the sealed battery; and a load for discharging the sealed battery under a prescribed condition.

A second aspect of the present invention provides a battery characteristic evaluation device of a sealed battery, comprising:

an electrolytic solution outside the sealed battery and contacting the electrolytic solution contained in the sealed battery;

an electrode dipped into the electrolytic solution outside the sealed battery;

a load for discharging the sealed battery under a prescribed condition; and a voltage measuring device measuring at least two voltages selected from a voltage between positive and negative electrodes of the sealed battery, a voltage between a positive electrode material used in a positive electrode of the sealed battery and the dipped electrode, and a voltage between a negative electrode material used in a negative electrode of the sealed battery and the dipped electrode.

A third aspect of the present invention provides a battery characteristic evaluation device of a sealed battery, comprising:

a load for discharging the sealed battery under a prescribed condition;

an electrolytic solution outside the sealed battery;

an electrode dipped into the electrolytic solution outside the sealed battery; wherein the voltage measuring device measures the voltage between positive and negative electrodes of the sealed battery, and the voltage between an electrode on the side of a can body of the sealed battery and the electrode dipped into the electrolytic solution, during discharge, and the electrode dipped into the electrolytic solution outside the sealed battery is placed near the can body of the sealed battery.

A fourth aspect of the present invention provides a battery characteristic evaluation method of a sealed battery, comprising:

bringing an electrolytic solution contained in the sealed battery into contact with and the electrolytic solution outside the sealed battery; and during discharge of the sealed battery under a prescribed condition, measuring at least two voltages selected from three voltages such as a voltage between positive and negative electrodes of the sealed battery, a voltage between a positive electrode material used in a positive electrode of the sealed battery and an electrode dipped into the electrolytic solution outside the sealed battery, and a voltage between a negative electrode material used in a negative electrode of the sealed battery and the electrode dipped into the electrolytic solution outside the sealed battery.

A fifth aspect of the present invention provides a battery characteristic evaluation method of a sealed battery, comprising:

providing a bore hole on a can body of the sealed battery so as not to impair the electric characteristic;

through the bore hole, bringing the electrolytic solution contained in the sealed battery into contact with the electrolytic solution outside the sealed battery having the same composition and concentration with the electrolytic solution contained in the sealed battery, and dipping the electrode into the electrolytic solution outside the sealed battery; and measuring the voltage between an electrode on the side of a can body of the sealed battery provided with a bore hole and an electrode dipped into the electrolytic solution during discharge of the sealed battery under a prescribed condition, and measuring the potential difference between the electrode material of the electrode on the side of a can body provided with a bore hole in the sealed battery and the standard electrode.

A sixth aspect of the present invention provides a battery characteristic evaluation method of a sealed battery, comprising:

providing a bore hole on a can body of the sealed battery so as not to impair the electric characteristic;

through the bore hole, bringing the electrolytic solution contained in the sealed battery into contact with the electrolytic solution outside the sealed battery having the same composition and concentration with the electrolytic solution contained in the sealed battery, and dipping an electrode into the electrolytic solution outside the sealed battery; and during discharge of the sealed battery under a prescribed condition, measuring a voltage between positive and negative electrodes of the sealed battery and a voltage between a can body of the sealed battery provided with a bore hole and the electrode dipped into the electrolytic solution, and from the both voltages thus obtained, calculating a potential difference between the electrode material of the electrode which is not on the side of a can body provided with a bore hole and the electrode dipped into the electrolytic solution.

A seventh aspect of the present invention provides a battery characteristic evaluation method of a sealed battery, comprising:

providing a bore hole on a can body of the sealed battery so as not to impair the electric characteristic;

through the bore hole, bringing the electrolytic solution contained in the sealed battery into contact with the electrolytic solution outside the sealed battery having the same composition and concentration with the electrolytic solution contained in the sealed battery, and dipping the standard electrode into the electrolytic solution outside the sealed battery; and during discharge of the sealed battery under a prescribed condition, measuring a voltage between positive and negative electrodes of the sealed battery and a voltage between a can body of the sealed battery provided with a bore hole and the electrode dipped into the electrolytic solution, and from the both voltages thus obtained, calculating a potential difference between the electrode material of the electrode which is not on the side of a can body provided with a bore hole and the electrode dipped into the electrolytic solution, and a potential difference between the electrode material of the electrode which is not on the side of a can body provided with a bore hole and the electrode dipped into the electrolytic solution, and a voltage between positive and negative electrodes.

In order to solve the problems, the battery characteristic evaluation device according to the first aspect of the present invention is capable of obtaining the potential difference between the electrode dipped into the electrolytic solution outside the sealed battery and the positive electrode material, and the potential difference between the electrode dipped into the electrolytic solution outside the sealed battery and the negative electrode material, without largely breaking the shape of the sealed battery, which is an evaluation object, in a shape close to an actual battery.

A battery characteristic evaluation device according to the second aspect of the present invention is capable of measuring at least two voltages selected from the voltage between positive and negative electrodes of the sealed battery, the voltage between the positive electrode material used in the positive electrode of the sealed battery and the electrode dipped into the electrolytic solution outside the sealed battery, and the voltage between the negative electrode material used in the negative electrode of the sealed battery and the electrode dipped into the electrolytic solution outside the sealed battery, and from the values thus obtained, the potential difference between the positive/negative electrode materials and the electrode dipped into the electrolytic solution outside the sealed battery can be respectively obtained, without largely breaking the shape of the sealed battery to be evaluated in a shape close to an actual battery.

The battery characteristic evaluation device of the third aspect of the present invention is capable of measuring the voltage between the electrode on the side of a can body and the electrode dipped into the electrolytic solution outside the sealed battery, and the voltage between positive and negative electrodes, without largely breaking the shape of the sealed battery to be evaluated in a shape close to an actual battery. Therefore, from the values thus obtained, the potential difference between the electrode dipped into the electrolytic solution outside the sealed battery and the positive/negative electrode materials can be respectively obtained.

According to a battery characteristic evaluation method of the fourth aspect of the present invention, without largely breaking the shape of the sealed battery to be evaluated in a shape close to an actual battery, by measuring at least two voltages selected from the three voltages such as the voltage between positive and negative electrodes of the sealed battery, the voltage between the positive electrode material used in the positive electrode of the sealed battery and the electrode dipped into the electrolytic solution outside the sealed battery, and the voltage between the negative electrode material used in the negative electrode of the sealed battery and the electrode dipped into the electrolytic solution outside the sealed battery, then, from the values thus obtained, the potential difference between the electrode dipped into the electrolytic solution outside the sealed battery and the positive electrode material and the potential difference between the electrode dipped into the electrolytic solution outside the sealed battery and the negative electrode material can be obtained.

According to a battery characteristic evaluation method of the fifth aspect of the present invention, without largely breaking the shape of the sealed battery to be evaluated in a shape close to an actual battery, the voltage between the electrode on the side of a can body provided with a bore hole and the electrode dipped into the electrolytic solution outside the sealed battery is measured, and the potential difference between the electrode dipped into the electrolytic solution outside the sealed battery and the electrode material of the electrode on the side of a can body provided with a bore hole can be measured.

According to a battery characteristic evaluation method of the sixth aspect of the present invention, without largely breaking the shape of the sealed battery to be evaluated in a shape close to an actual battery, the voltage between the electrode which is not on the side of a can body provided with a bore hole and the electrode dipped into the electrolytic solution outside the sealed battery can be obtained, and the potential difference between the electrode dipped into the electrolytic solution outside the sealed battery and the electrode material of the electrode which is not on side of a can body provided with a bore hole can be obtained.

According to a battery characteristic evaluation method of the seventh aspect of the present invention, without largely breaking the shape of the sealed battery to be evaluated in a shape close to an actual battery, the voltage between positive and negative electrodes, and the voltage between the electrode on the side of a can body provided with a bore hole and the electrode dipped into the electrolytic solution outside the sealed battery can be simultaneously measured, and from the values thus obtained, the potential difference between the electrode dipped into the electrolytic solution outside the sealed battery and the positive electrode material and the potential difference between the electrode dipped into the electrolytic solution outside the sealed battery and the negative electrode material can be obtained.

DESCRIPTION OF THE PREFERRED EMBODIMENTS

Figure 1:
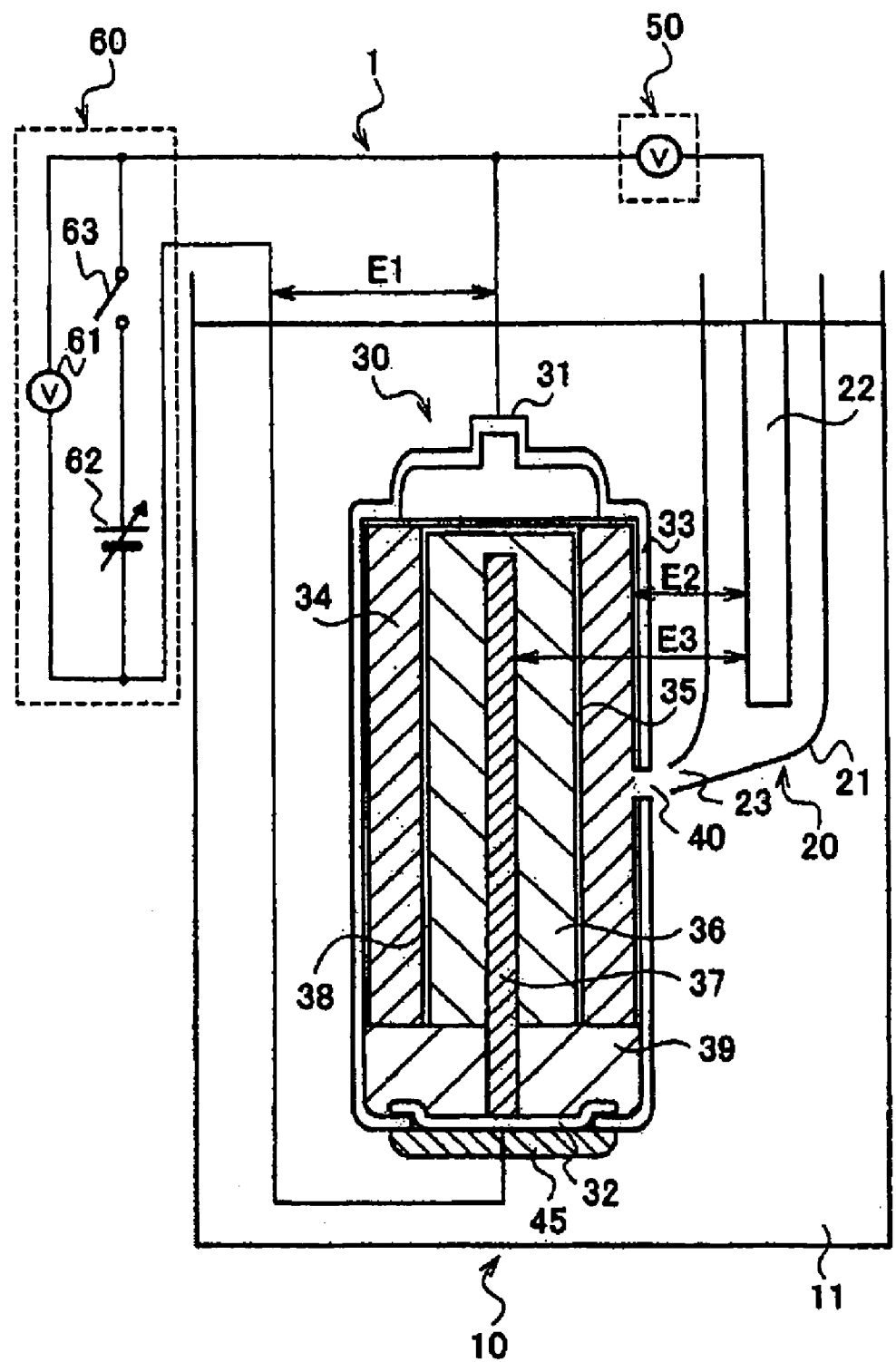
FIG. 1 is a schematic sectional view showing a battery characteristic evaluation device and a block diagram of a measurement circuit according to the present invention.

Researches were carried out to solve the above-described problem. That is, a bore hole was provided on one side or both sides of a can body contacting a positive electrode material or a negative electrode material of a sealed battery to be evaluated, thereafter the battery was dipped into an electrolytic solution having the same composition and concentration with the electrolytic solution of the battery, and thereby an electrolytic solution inside and outside the battery were brought into contact. Next, while measuring at least two voltages selected from three voltages such as a voltage between positive and negative electrodes of the battery, a voltage between an electrode dipped into the electrolytic solution outside the sealed battery (referred to as a standard electrode in some cases, hereafter) provided near outside the bore hole and a positive electrode near inside the bore hole (in a case where the bore hole is provided on a can body on the side of the positive electrode material), and the voltage between the standard electrode near outside the bore hole and a negative electrode near inside the bore hole (in a case where the bore hole is provided on a can body on the side of the negative electrode material), the battery was discharged under a prescribed condition. Then it was consequently found that the potential difference between the standard electrode and the electrode material placed in the inside of the bore hole could be measured in a state of an original shape of the sealed battery as a battery, which is a measuring object Meanwhile, sum total of the potential difference between the standard electrode and the positive/negative electrode materials becomes the voltage between the positive and negative electrodes of the battery, respectively. Therefore, by measuring at least two voltages selected from the three voltages, the remained voltage can be easily calculated.

Then, it was found that during discharge of the battery under a prescribed condition, the correlation between each voltage and potential obtained by measuring the battery voltage, the potential of the positive electrode material, the potential of the negative electrode material, and a discharging time had relevance to the battery characteristic, that is, each characteristic of the positive electrode material and the negative electrode material, thereby coming up to a new battery characteristic evaluation device and a battery characteristic evaluation method.

Here, the preferred embodiments of the present invention will be described below, with reference to the drawings.

In the description of the present invention, explanation will be given to a case where a cylindrical alkaline-manganese battery is used as an example of the sealed battery, and explanation will be given to a case where the bore hole is provided on a can body on the side of the negative electrode, and the voltage between positive and negative electrodes of the battery, and the voltage between the standard electrode and the negative electrode material in the inside of the bore hole are measured. Note that in the embodiment of the present invention, as a standard electrode, a reference electrode of Hg/HgO (referred to as a reference electrode hereafter) was used.

FIG. 1 is a schematic sectional view showing a battery characteristic evaluation device, and a block diagram of a measurement circuit according to the present invention.

First, explanation will be given to a battery characteristic evaluation device 1 according to the present invention.

The battery characteristic evaluation device 1 according to the present invention comprises a measuring cell 10, a voltage measuring device 50, and a discharging device 60. An electrolytic solution 11 outside an alkaline-manganese battery 30 which is an example of the sealed battery is filled in the measuring cell 10, and the alkaline-manganese battery 30 to be evaluated, and a reference electrode 20 dipped into the electrolytic solution 11 as a standard electrode are supported and placed by suitable supporting means (not shown).

The alkaline-manganese battery 30 has a positive electrode 31 and a negative electrode 32, and moreover, a bore hole 40 is provided on its can body 33. The inner structure of the alkaline-manganese battery 30 will be described later. Meanwhile, the reference electrode 20 includes a Luggin tube 21 in which an Hg/HgO electrode 22 is placed, and a tip end 23 of the Luggin tube 21 is placed 2-20 mm proximate to the bore hole 40 by the supporting means such as a clamp, and more preferably placed 2-10 mm proximate thereto.

The bore hole 40 of the alkaline-manganese battery 30 and the Hg/HgO electrode 22 are dipped into the electrolytic solution 11 within the measuring cell 10. However, the negative electrode 32 to which a measuring lead wire is connected is sealed in advance by a sealing material 45 such as a resin, so as not to come into contact with the electrolytic solution 11. The electrolytic solution 11 has the same composition and concentration with an electrolytic solution 38 within the alkaline-manganese battery 30 as will be described later. Instead of sealing the negative electrode 32 with the sealing material 45, this may be constructed to protrude upwardly from the liquid level of the electrolytic solution 11. However, by sealing the negative electrode 32 with the sealing material 45 and dipping the whole body of the alkaline-manganese battery 30 into the electrolytic solution 11, the temperature of the electrolytic solution 11 is controlled, and the temperature of the alkaline-manganese battery 30 is also easily controllable. Thus, it is preferable to dip the whole body of the alkaline-manganese battery 30 in the electrolytic solution 11.

The voltage measuring device 50 measures the voltage between the positive electrode 31 and the reference electrode 20. In the discharging device 60, a voltage measuring device 61, a load (variable current device) 62, and a switch 63 capable of discharging the battery to be evaluated under a prescribed condition (such as a current value, timing of ON-OFF, and the like) are placed.

Next, explanation will be given to the bore hole 40 and the structure of the alkaline-manganese battery 30.

From outside to inside sequentially, the alkaline-manganese battery 30, for example, is composed of manganese dioxide serving as a positive electrode material 34, a separator 35, zinc powder serving as a negative electrode material 36, and a brass rod plated with tin, for example serving as a negative electrode current collector 37 in an iron can body 33 having both surfaces thereof plated with nickel. In the can body 33, a positive electrode current collector becomes a positive pole by being brought into contact with the positive electrode material 34, and serves also as a positive electrode side lid part of the can body 33 by being joined with the positive electrode 31, and the negative electrode collector 37 becomes a negative pole by being brought into contact with the negative electrode material 36, and is joined with the negative electrode 32. The negative electrode 32 also serves as a negative electrode side lid part of the can body 33 together with a sealant 39 made of resin or the like. The positive electrode material 34, the separator 35, and the negative electrode material 36 are dipped into the electrolytic solution 38. The electrolytic solution 38 of the alkaline-manganese battery 30 is a KOH aqueous solution, for example.

Now, the bore hole 40 provided on the can body 33 will be explained. The bore hole 40 brings the electrolytic solution 38 contained within the alkaline-manganese battery 30 into contact with the electrolytic solution 11 contained within the measuring cell 10 as described in FIG. 1, and serves as a measurement window for measuring the characteristic of the battery as will be described later. Specifically, the bore hole 40 is provided in nearly the center of the can body 33 and is formed into the bore hole having diameter of 1 to 2 mm, and depth of 0.5 to 1 mm, without breaking the molded body of the positive electrode material 34 filled in the can body 33. Through the bore hole 40, as will be described later, the potential of the positive electrode material 34 is measured by the reference electrode 20. Because of structural restrictions in the reference electrode 20 (correct measurement preferably requires substantially the whole body of the Hg/HgO electrode 22 to be dipped into the electrolytic solution), the measurement is conducted in such a way that the alkaline-manganese battery 30 is dipped into the electrolytic solution 11 having the same composition with the electrolytic solution 38 contained in the battery, and the tip end 23 of the Luggin tube 21 is approximated the bore hole 40. Note that, the bore hole 40 is relatively minute compared with the entire body of the alkaline-manganese battery 30, and therefore the measurement is enabled while keeping nearly the same state of the battery before subjected to a bore hole drilling process.

Next, explanation will be given to a characteristic measurement method of the alkaline-manganese battery 30 by means of the battery characteristic evaluation device 1 according to the present invention.

First, the voltage measuring device 50 measures the voltage between the electrode on the side of the can body 33 and the reference electrode 20 (this voltage is referred to as E2), and the voltage measuring device 61 within the discharging device 60 measures the voltage between the positive electrode 31 and the negative electrode 32 (this voltage is referred to as E1). Further, the discharging device 60 applies a prescribed load on the alkaline-manganese battery 30 by means of the load 62 and the switch 63, and E1 and E2 of the alkaline-manganese battery 30 on which the load is applied are measured.

Here, although it is difficult to directly measure the voltage between the electrode which is not on the side of the can body 33 and the reference electrode 20 (this voltage is referred to as E3), the value of E3 can be calculated suitably from the values of E1 and E2 using a relation E1=E2+E3.

As a result, while applying a prescribe load on the alkaline-manganese battery 30 by means of the load 62 and the switch 63 within the discharging device 60 (for example, a constant-current continuous electric discharge is conducted while applying a prescribed load, or a pulse discharge is conducted while applying a prescribed load, etc), the potential difference between the reference electrode 20 and the positive electrode material 34 and the potential difference between the reference electrode 20 and negative electrode material 36 could be precisely measured respectively, and a change in each of the potentials with time could be also precisely measured. Thus, the change in each of the potentials of the positive electrode material 34 and the negative electrode material 36 with time could be precisely measured, and therefore a state of a resistant component, and a state of polarization in each electrode material could be grasped almost in the same state with an actual battery. As a result, it becomes possible to evaluate and select preferable positive electrode material 34 and negative electrode material 36 as an actual battery.

Namely, it can be said that the present invention provides effective battery characteristic evaluation device and the battery characteristic evaluation method, wherein the battery characteristic can be measured while keeping the shape of the battery close to the actual battery sealed in the can body, which was conventionally impossible, and the potential difference between the standard electrode and the positive electrode material, and the potential difference between the standard electrode and the negative electrode material can be clearly separated and precisely measured.

As described above, explanation has been given to the battery characteristic evaluation device and the battery characteristic evaluation method according to the present invention, using the cylindrical alkaline-manganese battery as a sealed battery, using the case as an example where the bore hole is provided on the can body on the side of the negative electrode, and the voltage between positive and negative electrodes, and the voltage between the electrolyte near the outside the bore hole and the negative electrode material near the inside the bore hole are measured.

Next, modified examples 1 to 3 of the battery characteristic evaluation device and the battery characteristic evaluation method according to the present invention will be explained with reference to FIGS. 8 to 10.

In the description of the modified examples 1 to 3, a button type alkaline-manganese battery is used as an example of the sealed battery, and explanation will be given to the case where the bore hole is provided on the can body on the side of the positive electrode and/or negative electrode, for example.

Figure 8:
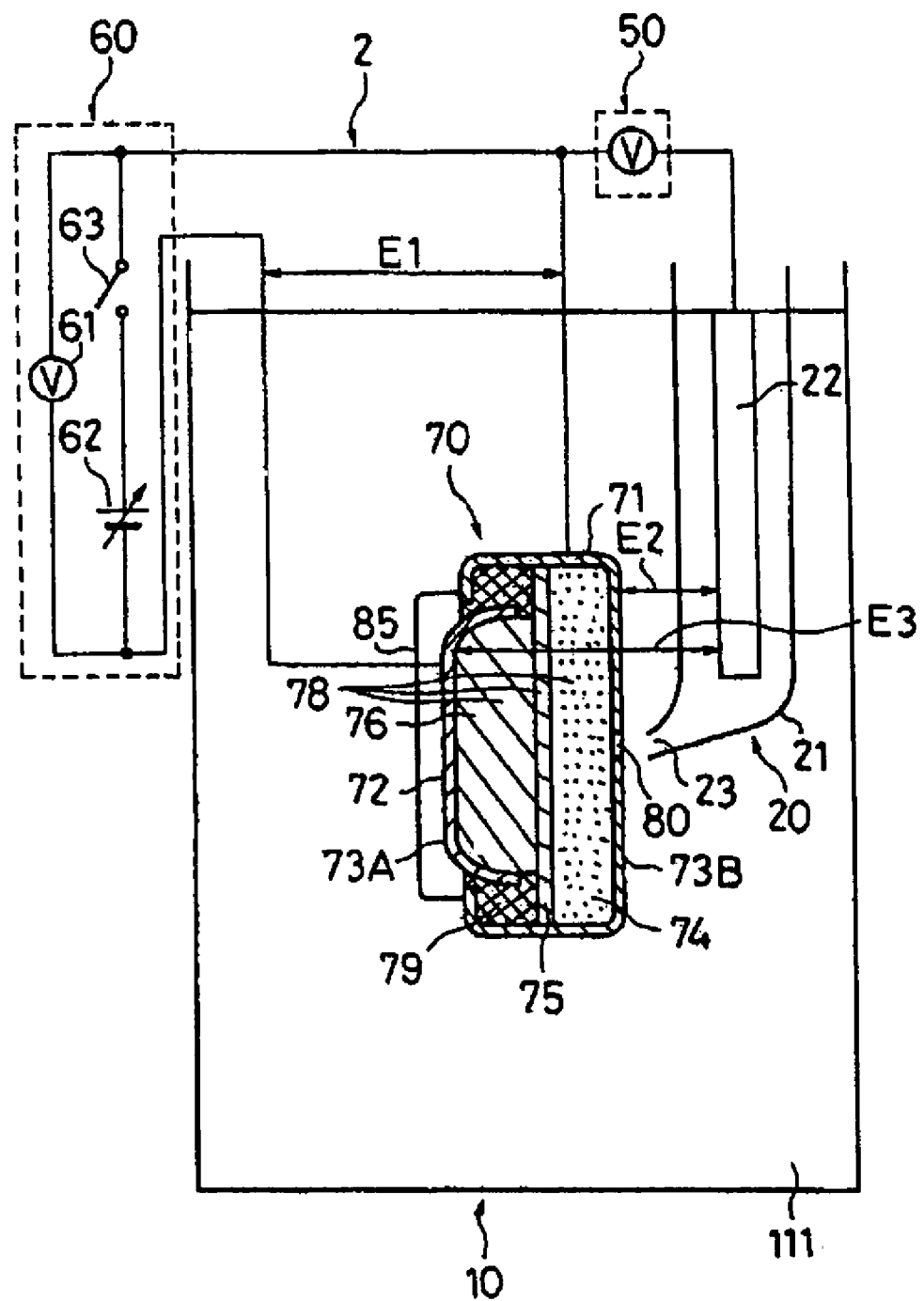
FIG. 8 is a schematic sectional view of a battery characteristic evaluation device and a block diagram of a measuring circuit according to modified example 1.
Figure 9:
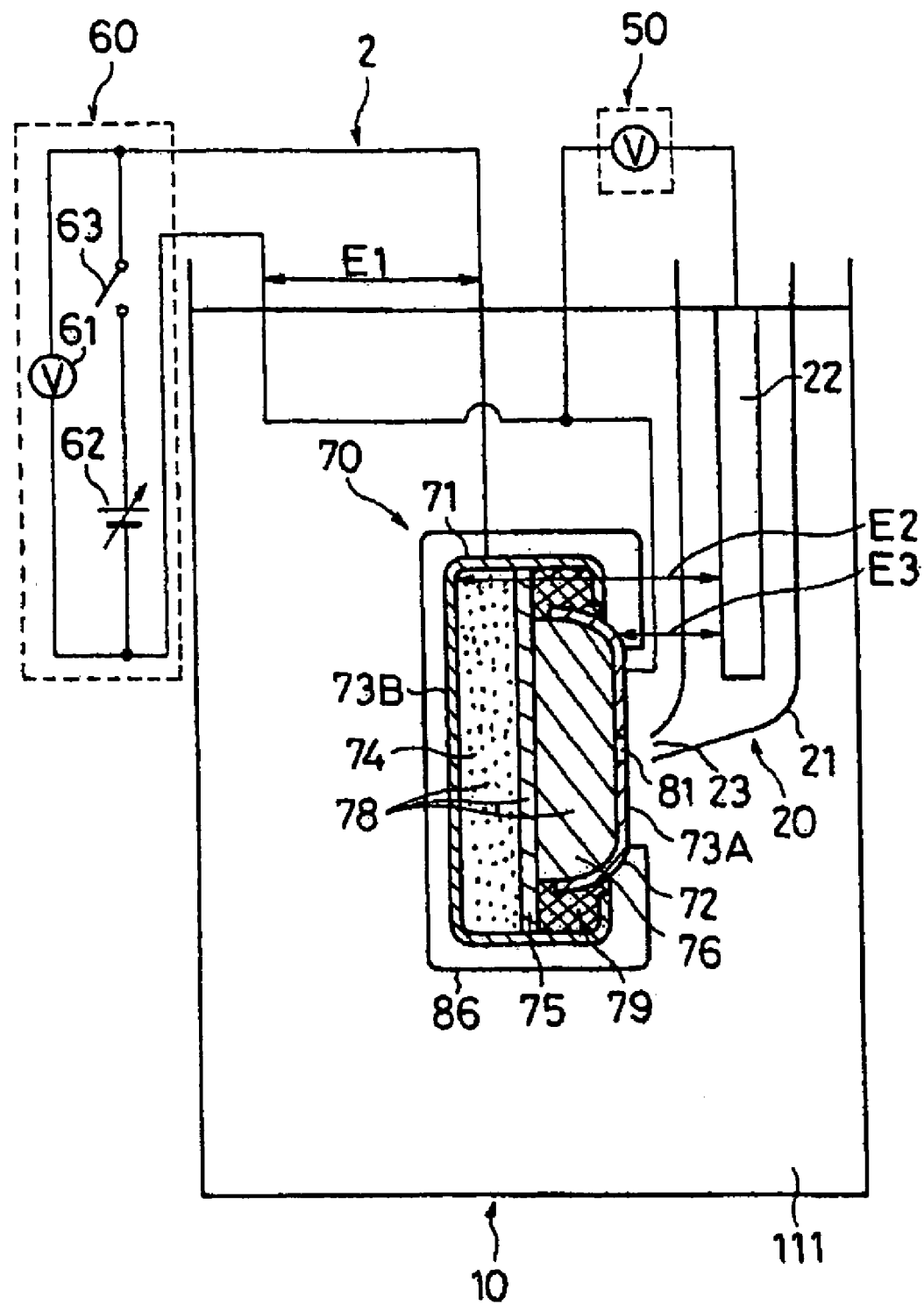
FIG. 9 is a schematic sectional view of the battery characteristic evaluation device and a block diagram of the measuring circuit according to modified example 2.
Figure 10:
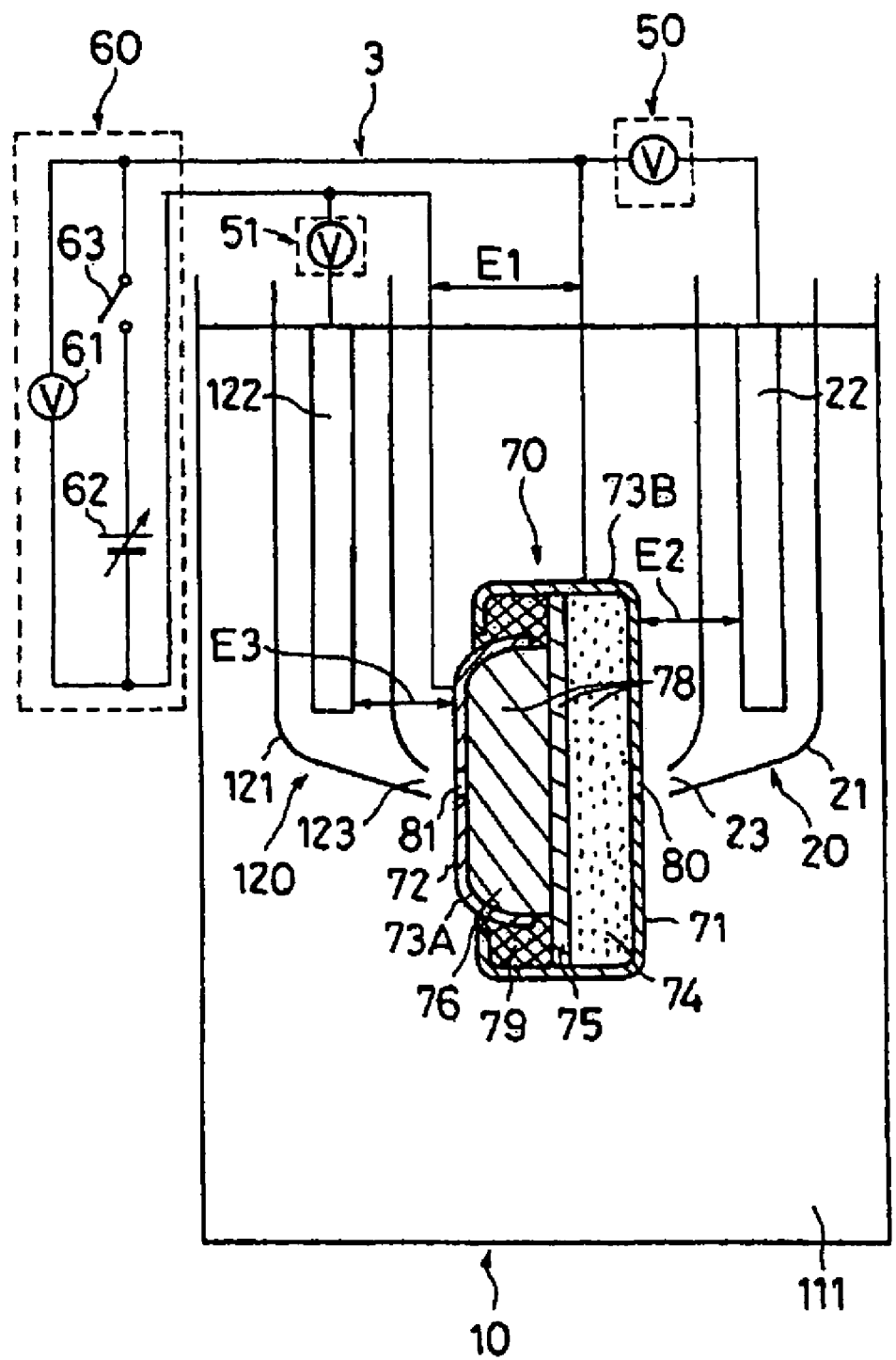
FIG. 10 is a schematic sectional view of the battery characteristic evaluation device and a block diagram of the measuring circuit according to modified example3.

Moreover, in the description of the modified examples 1 to 3, for the part explained in FIG. 1, the same numerals and signs with those used in FIG. 1 are used and thus overlapping explanation and description are omitted in FIGS. 8 to 10.

Here, FIG. 8 is a schematic sectional view of the battery characteristic evaluation device and a block diagram of a measurement circuit according to the modified example 1.

First, in a battery characteristic evaluation device 2 according to the modified example 1, the measuring cell 10, the voltage measuring device 50, the discharging device 60, and the reference electrode 20 are the same with those of the battery characteristic evaluation device 1 explained in FIG. 1, and a button type alkaline-manganese battery 70 is used as a sealed battery.

Next, the structure of the button type alkaline-manganese battery 70 and a bore hole 80 will be explained.

The button type alkaline-manganese battery 70 is filled with a manganese dioxide serving as a positive electrode material 74, a separator 75, and zinc powder serving as a negative electrode material 76, sequentially from the right side facing the figure, in an iron can body 73B having both surfaces thereof plated with nickel, and covered with a can body 73A of the negative electrode side. A can body 73B of the positive electrode side is brought into contact with a positive electrode material 74 to become a positive electrode 71, and the can body 73A of the negative electrode side is brought into contact with the negative electrode material 76 to become a negative electrode 72. In addition, the can body 73A of the negative electrode side is electrically insulated from the can body 73B of the positive electrode side by a sealant 79 made of a resin, etc., to become a lid part. The positive electrode material 74, the separator 75, and the negative electrode material 76 are dipped into an electrolytic solution 78. The electrolytic solution 78 of the button type alkaline-manganese battery 70 is a KOH aqueous solution, for example.

Here, the bore hole 80 provided in nearly the center of the can body 73B of the positive electrode side has the same structure with the bore hole explained in FIG. 1. However, when the button type alkaline-manganese battery 70 is small in size, both of the diameter and depth of the bore hole are preferably set to be small accordingly.

Next, the characteristic measuring method of the button type alkaline-manganese battery 70 of the battery characteristic evaluation device 2 according to the present invention will be explained.

First, in the same manner as explained in FIG. 1, the tip end 23 of the Luggin tube 21 is placed 2-20 mm proximate to the bore hole 80 by supporting means such as a clamp, and more preferably placed 2-10 mm proximate thereto.

The bore hole 80 of the button type alkaline-manganese battery 70 and the Hg/HgO electrode 22 are dipped into the electrolytic solution 111 within the measuring cell 10. However, the positive electrode 72 to which a measuring lead wire is connected is sealed in advance by a sealing material 85 such as a resin, etc., so as not to come into contact with the electrolytic solution 111. Note that the electrolytic solution 111 has the same composition and concentration with the electrolytic solution 78 contained in the button type alkaline-manganese battery 70.

Meanwhile, the voltage measuring device 50 measures the voltage between the can body 73B of the positive electrode side and the reference electrode 20 (This is referred to as E2), and the voltage measuring device 61 in the discharging device 60 measures the voltage between the positive electrode 71 and the negative electrode 72 (This is referred to as E2). Further, the discharging device 60 applies a prescribed load on the button-type alkaline-manganese battery 70. Then, E1 and E2 of the button-type alkaline-manganese battery 70 having the load applied thereon are measured.

Here, the voltage between the can body 73A of the negative electrode side and the reference electrode 20 (This is referred to as E3) can be calculated by using the relation E1=E2+E3. Thus, from the values of E1 and E2, the value of E3 can be suitably obtained.

Consequently, while applying the same prescribed load as described in the embodiment explained in FIG. 1 on the button-type alkaline-manganese battery 70, the potential difference between the reference electrode 20 and the positive electrode material 74 and the potential difference between the reference electrode 20 and the negative electrode material 76 could be correctly measured, respectively, and also the change in each potential difference with time could be measured. As a result, in the same manner as described in FIG. 1, it becomes possible to evaluate and select the positive electrode material 74 and the negative electrode material 76 preferably as an actual battery.

Next, different modified example 2 will be explained by using FIG. 9. FIG. 9 is a schematic sectional view of the battery characteristic evaluation device and a block diagram of the measurement circuit according to the different modified example 2.

The battery characteristic evaluation device 2 according to the modified example 2 has the same structure with the battery characteristic evaluation device 2 explained in modified example 1. Also, the button type alkaline-manganese battery 70 itself has also the same structure with the button type alkaline-manganese battery 70 explained in modified example 1.

Here, a bore hole 81 and a sealing material 86 provided on the button type alkaline-manganese battery 70 will be explained. In modified example 2, the bore hole 81 is provided nearly in the center of the can body 73A on the negative electrode side, and the bore hole diameter or the like has the same structure with the bore hole 80 explained in modified example 1. The can body 73B on the side of the positive electrode is sealed by the sealing material 86, and therefore is not brought into contact with the electrolytic solution 111 even if the button type alkaline-manganese battery 70 is dipped thereinto.

In the same way as described in modified example 1, the button type alkaline-manganese battery 70 is connected to the discharging device 60, and is dipped into the electrolytic solution 111. Then, the tip end 23 of the Luggin tube 21 is placed 2-20 mm proximate to the bore hole 81, and more preferably placed 2-10 mm proximate thereto.

Next, a characteristic measurement method of the button type alkaline-manganese battery 70 according to modified example 2 will be explained.

First, the voltage measuring device 50 measures the voltage between the electrode of the can body 73A on the side of the negative electrode and the reference electrode 20 (this is referred to as E3), and the voltage measuring device 61 within the discharging device 60 measures the voltage between the positive electrode 71 and the negative electrode 72 (this is referred to as E1). Further, the discharging device 60 applies a prescribed load on the alkaline-manganese battery 70 in the same way as described in modified example 1, and E1 and E3 of the button type alkaline-manganese battery 70 on which the load is applied is measured.

Here, the voltage between the positive electrode side can body 73B and the reference electrode 20 (this is referred to as E2) can be calculated from the values of E1 and E3 by using the relation E1=E2+E3.

As a result, while applying on the button type alkaline-manganese battery 70 the same prescribed load as described in the embodiment explained using FIG. 1, the potential difference between the positive electrode material 74 and the reference electrode 20, and the potential difference between and negative electrode material 76 and the reference electrode 20 could be correctly measured, respectively, and the change in each of the potential difference with time could also be measured. Consequently, in the same way as described in FIG. 1, it became possible to evaluate and select the positive electrode material 74 and the negative electrode material 76 preferable as an actual battery.

Next, different modified example 3 will be explained by using FIG. 10. FIG. 10 is a schematic sectional view of the battery characteristic evaluation device and a block diagram of a measurement circuit according to the different modified example 3.

The battery characteristic evaluation device 3 according to modified example 3 has the same structure with the above-described battery characteristic evaluation device 2 excepting that a second reference electrode 120 and a voltage measuring device 51 are provided in addition to the first reference electrode 20 and the voltage measuring device 50.

Meanwhile, the button type alkaline-manganese battery 70 itself according to modified example 3 is the same one as explained in modified example 1, but has both bore holes of a first bore hole 80 provided on the can body 73B on the side of the positive electrode explained in modified example 1, and a second bore hole 81 provided on the can body 73A on the side of the negative electrode explained in modified example 2. Moreover, the positive electrode 71 and the negative electrode 72 of the button type alkaline-manganese battery 70 are connected to the discharging device 60 in the same way as described in modified example 1. Note that in modified example 3, it is not necessary to seal the can body by the sealing material, differently from modified examples 1 and 2 where the sealing of the can body is executed.

Here, in the same way as described in modified example 1, the tip end 23 of the Luggin tube 21 is placed 2-20 mm proximate to the bore hole 80, and more preferably placed 2-10 mm proximate thereto. In addition, in modified example 3, in the same way as described in modified example 2, the tip end 123 of the Luggin tube 121 is placed 2-20 mm proximate to the bore hole 81, and more preferably placed 2-10 mm proximate thereto, and the button type alkaline-manganese battery 70, the reference electrodes 20 and 120 are dipped into the electrolytic solution 111.

Next, a characteristic measurement method of the button type alkaline-manganese battery 70, which is the sealed battery according to modified example 3 will be explained.

First, the voltage measuring device 50 measures the voltage between the can body 73B on the side of the positive electrode and the reference electrode 20 (this is referred to as E2). Meanwhile, the voltage measuring device 51 measures the voltage between the can body 73A on the side of the negative electrode and the reference electrode 120 (this is referred to as E3).

Further, the discharging device 60 applies a prescribed load on the alkaline-manganese battery 70 in the same way as described in modified example 1, and E2 and E3 of the button type alkaline-manganese battery 70 on which the load is applied are measured.

As a result, the potential difference between the positive electrode material 74 and the reference electrode 20, and the potential difference between the negative electrode material 76 and the reference electrode 120 could be respectively measured, and the change in each of the potential differences with time could be measured. Consequently, in the same way as described in FIG. 1, it became possible to evaluate and select the positive electrode material 74 and the negative electrode material 76 preferable as an actual battery.

As described above, the embodiments according to the present invention and the modified examples 1 to 3 have been explained. However, the measuring sealed battery of the present invention is not limited to the above-described cylindrical alkaline-manganese battery and button type alkaline-manganese battery, but is applicable to a cylindrical manganese battery, a button-type alkaline-manganese battery, a button-type silver oxide battery, a button-type lithium battery, etc., so long as the battery is a sealed battery wherein a positive electrode material and a negative electrode material are not arranged in a spiral structure but are stacked in a concentric structure or in a flat plate structure. Moreover, in the embodiments and the modified examples of the present invention, the reference electrode having Hg/HgO electrode is used as a standard electrode. However, in addition to this, as a standard electrode, a calomel electrode and various kinds of metal electrodes are usable.

Next, the present invention will be explained in more detail using examples.

EXAMPLE 1

An AA cylindrical alkaline-manganese battery sample 501 was prepared, and a bore hole having a diameter of 1 mm and a depth of 0.5 mm was provided using a drill approximately in the center portion of the side face of a can body. Next, lead wires were provided on a positive electrode and a negative electrode of the battery sample 501, respectively, and a sealing material made of resin was applied on the negative electrode, so as not to come into contact with an electrolytic solution. Then, the battery sample 501 was placed in a measuring cell in which the electrolytic solution of the battery characteristic evaluation device is filled.

At this time, the electrolytic solution contained within the measuring cell was selected to be 40%-KOH aqueous solution having the same composition and concentration with the electrolytic solution contained within the battery sample 501, and the temperature of the electrolytic solution (measuring temperature) was set at 20° C.

Next, a reference electrode having Hg/HgO electrode placed in a Luggin tube was placed so that the tip end of the Luggin tube is positioned at about 10 mm distant from the bore hole provided on the battery sample 501.

Then, a discharging device was set to apply a prescribed load on the battery sample 501, amounting to continuous discharge of 1A, and a voltage between the positive electrode and the negative electrode and a voltage between the positive electrode and the reference electrode were measured per discharging time. The voltage between the negative electrode and the reference electrode was then calculated from the values thus measured. The measurement results are shown by a thick solid line in FIGS. 2 to 4.

Figure 2:
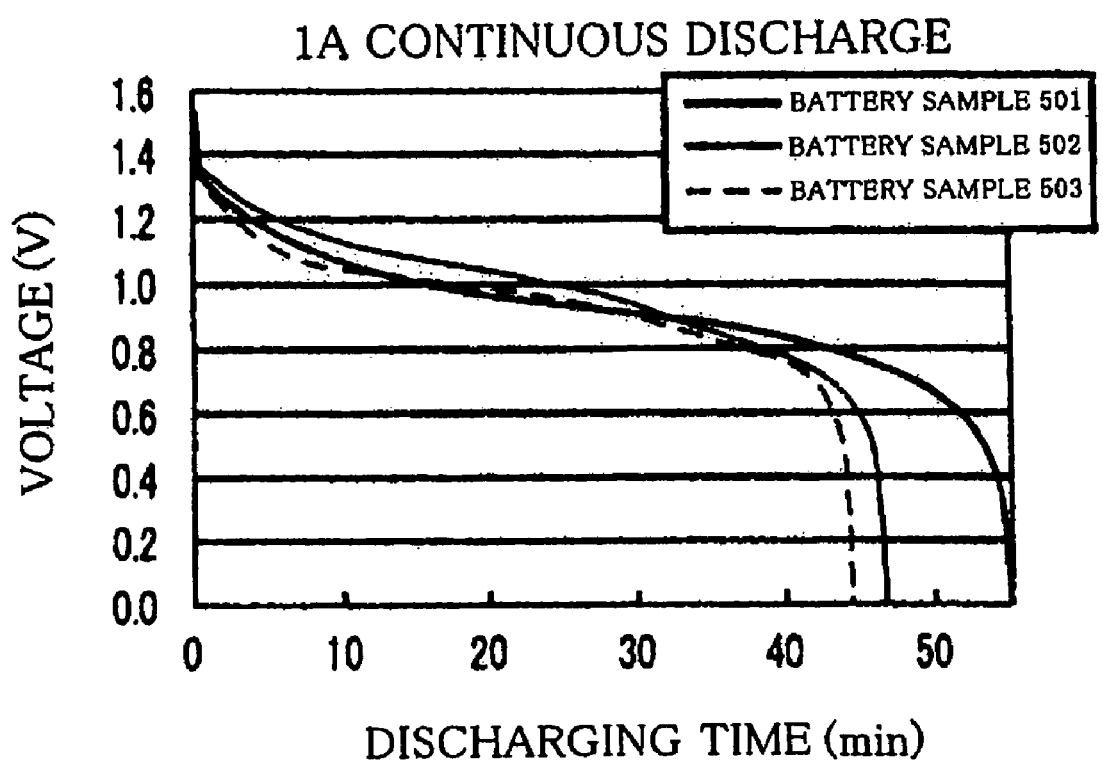
FIG. 2 is a graph showing a voltage per every discharging time between a positive electrode and a negative electrode of a battery sample according to an embodiment.
Figure 3:
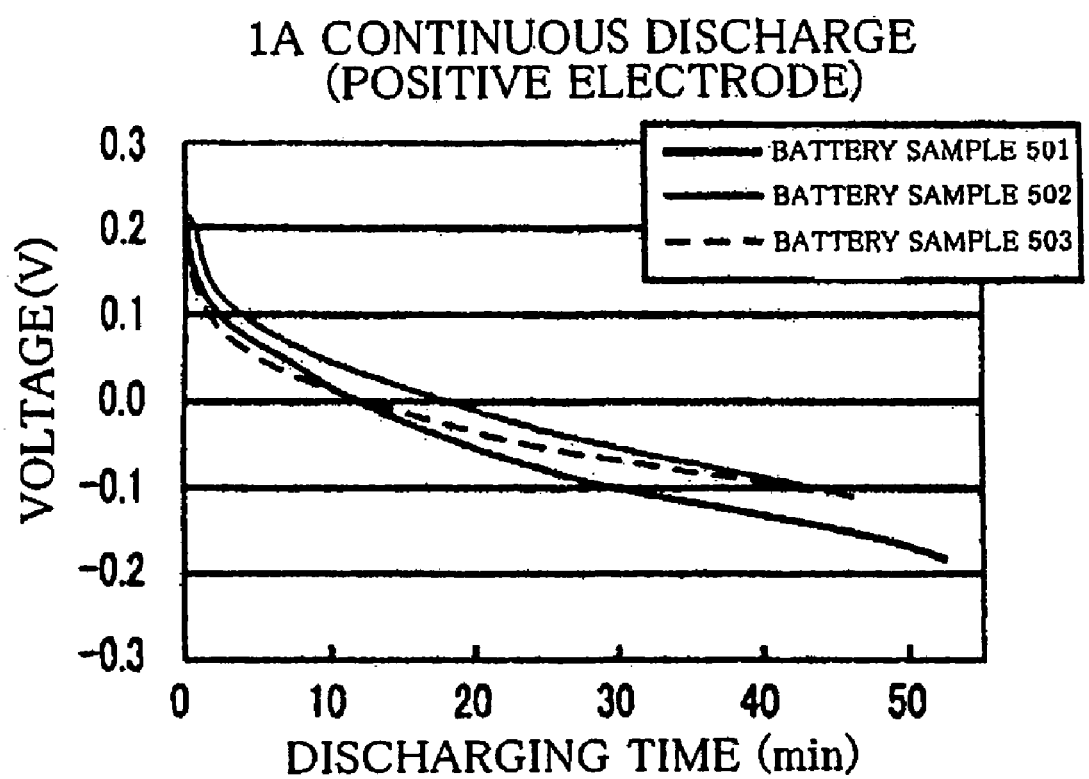
FIG. 3 is a graph showing the voltage per every discharging time between the positive electrode of the battery sample and the reference electrode according to the embodiment.
Figure 4:
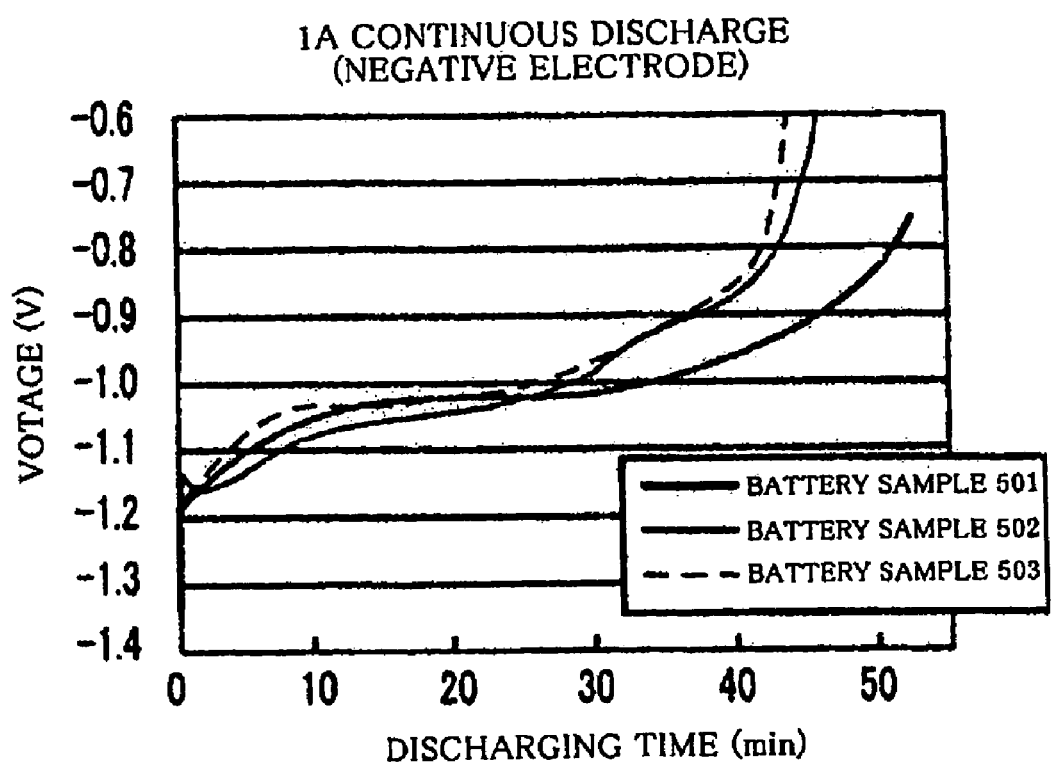
FIG. 4 is a graph showing the voltage per every discharging time between the negative electrode of the battery sample and the reference electrode according to the embodiment.

FIGS. 2 to 4 are graphs in which the measured or calculated voltage is positioned in the axis of ordinates, and the discharging time is positioned in the axis of abscissas. FIG. 2 shows a voltage between a positive electrode and a negative electrode per discharging time, FIG. 3 shows a voltage between a positive electrode and a reference electrode per discharging time, and FIG. 4 shows a voltage between a negative electrode and a reference electrode per discharging time.

EXAMPLE 2

An AA cylindrical alkaline-manganese battery sample 502 of a brand different from the battery sample 501 was prepared, and the same test with example 1 was conducted. The measurement results are shown by a solid line in FIGS. 2 to 4 in the same way as described in the example 1.

EXAMPLE 3

An AA cylindrical alkaline-manganese battery sample 503 of a brand different from the battery samples 501 and 502 was prepared, and the same test with Example 1 was conducted. The measurement results are shown by a dotted line in FIGS. 2 to 4 in the same way as the example 1.

ANALYSIS OF EXAMPLES 1-3

1) From FIG. 2, it was found that the discharging capacity of the battery sample 501 is the largest, followed by battery sample 502 and battery sample 503 in this order.

As described above, the discharging capacity of the battery sample 501 is the largest, and the reason was found from FIGS. 3 and 4 in which the polarization of the positive electrode material was large as seen from FIG. 3, whereas the polarization of the negative electrode material was small as seen from FIG. 4 in the battery sample 501.

On the other hand, as described above, the discharging capacity of the battery sample 503 is the smallest and the reason was found from FIG. 3 and FIG. 4 in which the polarization of the positive electrode material was not so large as seen from FIG. 3, whereas the polarization of the negative electrode material was large as seen from FIG. 4 in the battery sample 503.

2) From FIG. 2, the voltage between the positive electrode and the negative electrode of the battery sample 502 was the largest for 30 minutes since the discharge started, however thereafter, remarkably dropped. The reason was found from FIGS. 3 and 4 in which the polarization of the positive electrode material was not so large as seen from FIG. 3, whereas the polarization of the negative electrode material became large after elapsed time of 30 minutes since the discharge started as seen from FIG. 4.

As described above, from the analysis cases of 1) and 2), it is realized that the battery characteristic evaluation method of the present invention is effective in evaluating the positive and negative electrode materials of the battery sample, respectively.

EXAMPLE 4

An AA cylindrical alkaline-manganese battery sample 504 was prepared, and the same test with Example 1 was conducted excepting that a discharge condition for the battery sample 504 was set so that a load, which was a pulse discharge of 2A-2 seconds and 0A-28 seconds, was applied. The measurement results are shown by a dotted line in FIGS. 5 to 7.

Figure 5:
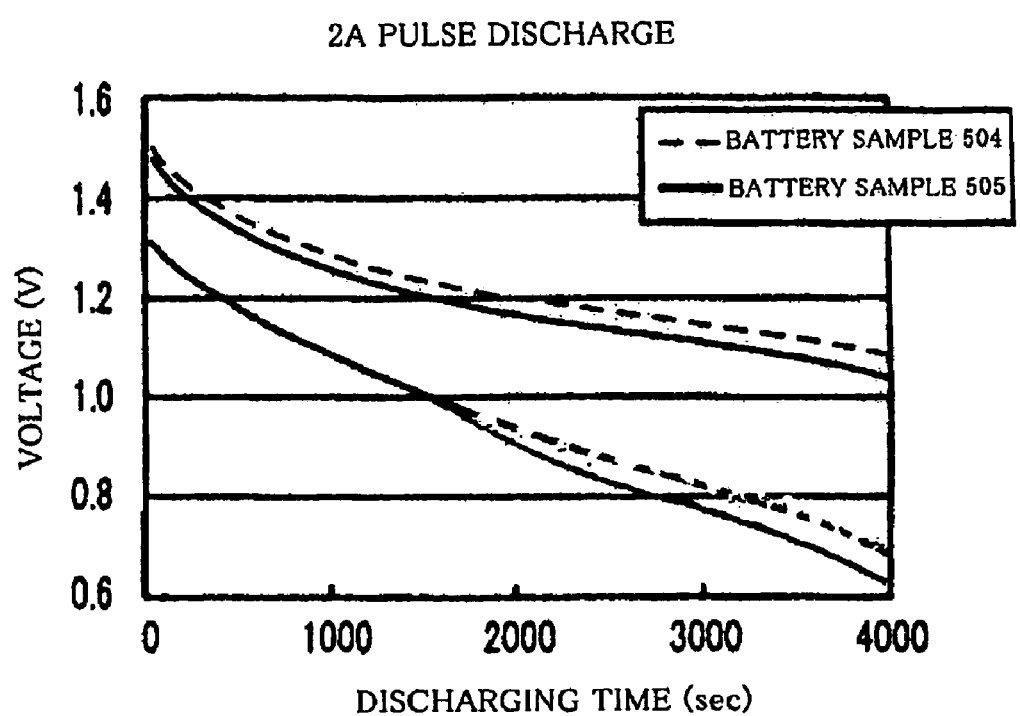
FIG. 5 is a graph showing the voltage per every pulse discharging time between the positive electrode and the negative electrode of the battery sample according to the embodiment.
Figure 6:
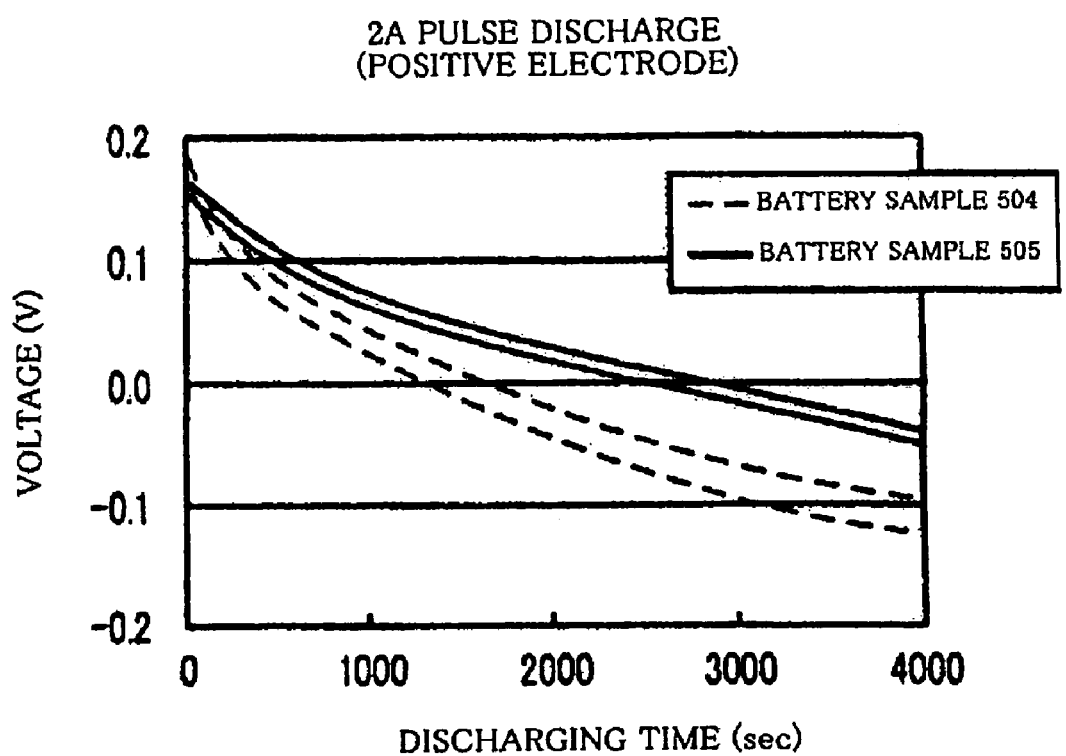
FIG. 6 is a graph showing the voltage per every pulse discharging time between the positive electrode of the battery sample and the reference electrode according to the embodiment.
Figure 7:
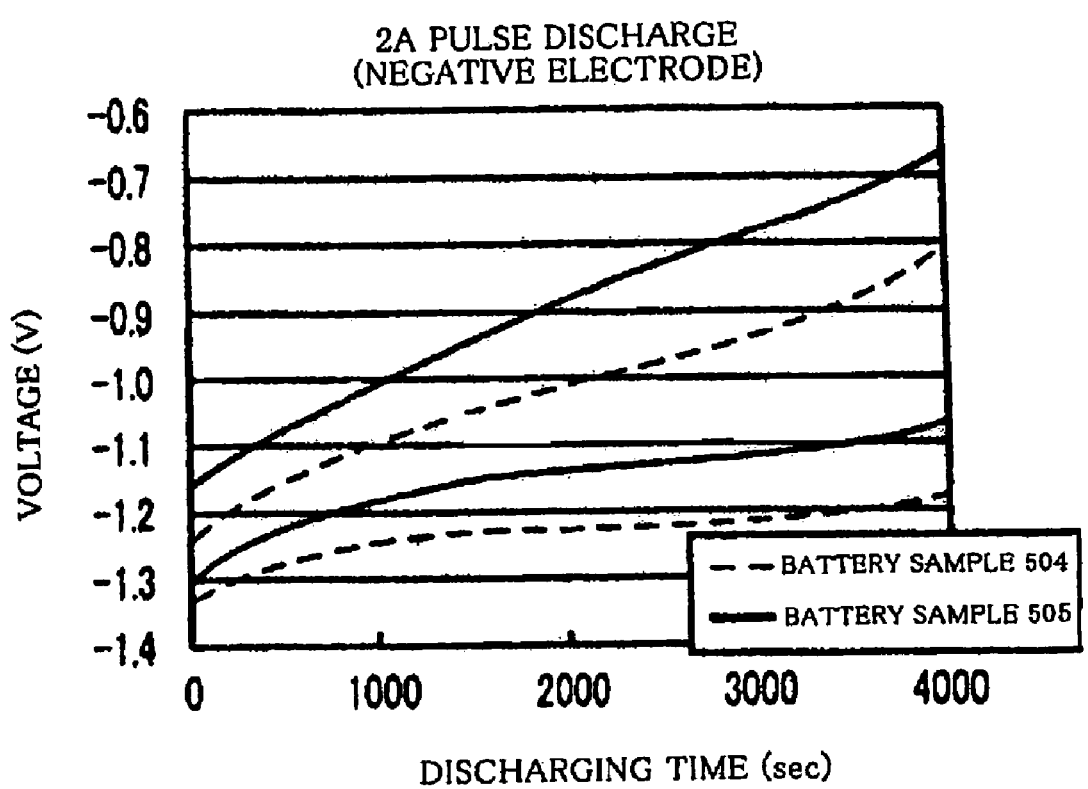
FIG. 7 is a graph showing the voltage per every pulse discharging time between the negative electrode of the battery sample and the reference electrode according to the embodiment.

FIG. 5 to FIG. 7 are graphs in which the measured or calculated voltage is positioned in the axis of ordinates, and the discharging time is positioned in the axis of abscissas. FIG. 5 shows the voltage between the positive electrode and the negative electrode per discharging time, FIG. 6 shows the voltage between the positive electrode and the reference electrode per discharging time, and FIG. 7 shows the voltage between the negative electrode and the reference electrode per discharging time. The upper limit values and the lower limit values of the data related to the pulse discharge of the battery sample 504 are connected and illustrated by an envelope, respectively.

EXAMPLE 5

An AA cylindrical alkaline-manganese battery sample 505 which is different brand from the battery sample 504 was prepared, and the same test with Example 4 was conducted. The measurement results are shown by a solid line in FIGS. 5 to 7 in the same way as shown in Example 4.

ANALYSIS OF EXAMPLES 4 AND 5

1) As seen from FIG. 5, the discharging voltage of the battery sample 504 is always higher than that of the battery sample 505, and the discharging capacity of the battery sample 504 is also larger than that of the battery sample 505.

As described above, the discharging voltage and the discharging capacity of the battery sample 504 is large, and the reason was found from FIG. 6 and FIG. 7 in which the polarization of the positive electrode material is smaller in the battery sample 505 as seen from FIG. 6, whereas the polarization of the negative electrode material is smaller in the battery sample 504 as seen from FIG. 7.

Namely, a difference in discharging voltage and a difference in capacity between the battery samples 504 and 505 are so interpreted that the polarization of the negative electrode material of the battery sample 504 is fully smaller than that of the battery sample 505, compensating for the larger polarization of the positive electrode material of the battery sample 504 compared with the polarization of the positive electrode material of the battery sample 505, thus maintaining a preferable battery characteristic.

2) It was found from FIG. 6, that a difference between an open circuit voltage (hereinafter referred to as OCV) and a closed circuit voltage (hereinafter referred to as CCV) was small. Here, the difference between OCV and CCV can be regarded as a resistant component (IR component) of the electrode, and therefore it can be said that the positive electrode itself of the battery sample 505 has a low electrical resistance and is in a good state as an electrode.

From the above analysis cases of 1) and 2), it was found that if the battery sample could be prepared by combining the negative electrode of the battery sample 504 and the positive electrode of the battery sample 505, the battery which was capable of exhibiting a very good characteristic under the pulse discharge of 2A-2 seconds and 0A-28 seconds was achieved.

From the above-described examples, it is realized that the battery characteristic evaluation method of the present invention is effective in evaluating positive and negative electrode materials of the battery sample, respectively.

What is claimed is:

1. A battery characteristic evaluation method of a cylindrical alkaline-manganese battery, a cylindrical manganese battery, a button-type alkaline-manganese battery, a button-type silver oxide battery, or a button-type lithium battery, which are sealed batteries, comprising:

providing a bore hole on a can body of the sealed battery so as not to impair the battery characteristic of the sealed battery;

through the bore hole, bringing an electrolytic solution contained in the sealed battery into contact with the electrolytic solution outside the sealed battery having the same composition and concentration with the electrolytic solution contained in the sealed battery;

dipping an electrode into the electrolytic solution outside the sealed battery, and during discharge of the sealed battery under a prescribed condition, measuring a voltage between an electrode of the sealed battery provided with a bore hole and an electrode dipped into the electrolytic solution, and measuring a potential difference between an electrode material of the sealed battery on a side of the can body provided with the bore hole and the electrode dipped into the electrolytic solution.

* * * * *